US010625277B2

(12) United States Patent
Lubomirsky et al.

(10) Patent No.: US 10,625,277 B2
(45) Date of Patent: Apr. 21, 2020

(54) SHOWERHEAD HAVING A DETACHABLE GAS DISTRIBUTION PLATE

(71) Applicant: APPLIED MATERIALS, INC., Santa Clara, CA (US)

(72) Inventors: Dmitry Lubomirsky, Cupertino, CA (US); Vladimir Knyazik, Palo Alto, CA (US); Hamid Noorbakhsh, Fremont, CA (US); Jason Della Rosa, Campbell, CA (US); Zheng John Ye, Santa Clara, CA (US); Jennifer Y. Sun, Mountain View, CA (US); Sumanth Banda, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 92 days.

(21) Appl. No.: 15/449,239

(22) Filed: Mar. 3, 2017

(65) Prior Publication Data

US 2017/0178863 A1    Jun. 22, 2017

Related U.S. Application Data

(63) Continuation of application No. 13/833,257, filed on Mar. 15, 2013, now Pat. No. 9,610,591.
(Continued)

(51) Int. Cl.
*C23C 16/40* (2006.01)
*B05B 1/00* (2006.01)
(Continued)

(52) U.S. Cl.
CPC ............... *B05B 1/005* (2013.01); *B05B 1/185* (2013.01); *C23C 16/45565* (2013.01);
(Continued)

(58) Field of Classification Search
CPC . B05B 1/005; C23C 16/45565; H01J 37/3244
(Continued)

(56) References Cited

U.S. PATENT DOCUMENTS 5,558,717 A    9/1996 Zhao
5,722,668 A    3/1998 Rice
(Continued)

FOREIGN PATENT DOCUMENTS

CN    2848267 Y    12/2006
JP    2000-058510 A    2/2000
JP    2004-538633    12/2004

OTHER PUBLICATIONS

U.S. Appl. No. 62/297,930, filed Feb. 21, 2016, Noorbakhsh et al.
(Continued)

*Primary Examiner* — Rudy Zervigon
(74) *Attorney, Agent, or Firm* — Moser Taboada; Alan Taboada

(57) ABSTRACT

Embodiments of showerheads having a detachable gas distribution plate are provided herein. In some embodiments, a showerhead for use in a substrate processing chamber includes a body having a first side and an opposing second side; a gas distribution plate disposed proximate the second side of the body; and a clamp disposed about a peripheral edge of the gas distribution plate to removably couple the gas distribution plate to the body, wherein the body is electrically coupled to the gas distribution plate through the clamp.

20 Claims, 2 Drawing Sheets

Related U.S. Application Data

(60) Provisional application No. 61/756,545, filed on Jan. 25, 2013.

(51) Int. Cl.
  *C23C 16/455* (2006.01)
  *H01J 37/32* (2006.01)
  *B05B 1/18* (2006.01)

(52) U.S. Cl.
  CPC ....... *H01J 37/3211* (2013.01); *H01J 37/3244* (2013.01); *H01J 37/32146* (2013.01); *H01J 37/32183* (2013.01); *H01J 37/32467* (2013.01); *H01J 37/32522* (2013.01); *H01J 37/32623* (2013.01)

(58) Field of Classification Search
  USPC .................. 118/723 E; 156/345.43–345.45
  See application file for complete search history.

(56) References Cited

U.S. PATENT DOCUMENTS

| | | | |
|---|---|---|---|
| 5,746,875 A * | 5/1998 | Maydan | C23C 16/45574 118/723 E |
| 5,766,364 A | 6/1998 | Ishida | |
| 6,036,782 A | 3/2000 | Tanaka | |
| 6,200,415 B1 * | 3/2001 | Maraschin | H01J 37/32431 118/715 |
| 6,772,827 B2 | 8/2004 | Keller et al. | |
| 7,743,730 B2 | 6/2010 | Kholodenko et al. | |
| 7,827,931 B2 | 11/2010 | Matsushima | |
| 8,147,648 B2 | 4/2012 | Dhindsa | |
| 8,161,906 B2 | 4/2012 | Kadkhodayan | |
| 8,313,610 B2 | 11/2012 | Dhindsa | |
| 9,064,909 B2 | 6/2015 | Dhindsa | |
| 9,111,968 B2 | 8/2015 | Kholodenko et al. | |
| 2004/0074609 A1 | 4/2004 | Fischer et al. | |
| 2004/0129211 A1 | 7/2004 | Blonigan et al. | |
| 2006/0086318 A1 | 4/2006 | Matsubara et al. | |
| 2008/0308228 A1 | 12/2008 | Stevenson | |
| 2009/0081878 A1 | 3/2009 | Dhindsa | |
| 2009/0188625 A1 * | 7/2009 | Carducci | H01J 37/32467 156/345.34 |
| 2009/0305509 A1 | 12/2009 | Stevenson | |
| 2010/0003824 A1 * | 1/2010 | Kadkhodayan | H01J 37/32091 438/710 |
| 2010/0184298 A1 * | 7/2010 | Dhindsa | H01J 37/3244 438/710 |
| 2010/0261354 A1 | 10/2010 | Bettencourt et al. | |
| 2011/0083809 A1 | 4/2011 | De La Llera et al. | |
| 2012/0304933 A1 * | 12/2012 | Mai | C23C 16/45565 118/723 I |
| 2014/0209027 A1 | 7/2014 | Lubomirsky et al. | |
| 2015/0325416 A1 | 11/2015 | Kholodenko et al. | |
| 2016/0005571 A1 | 1/2016 | Della Rosa et al. | |

OTHER PUBLICATIONS

International Search Report and Written Opinion dated May 19, 2014 for PCT Application No. PCT/US2014/011756.

Search Report received from the State Intellectual Property Office of the People's Republic of China for Chinese Application No. 2014800043467 dated Feb. 9, 2017.

Search Report from the State Intellectual Property Office of the People's Republic of China for China Application No. 2017108119991 dated Sep. 14, 2018.

* cited by examiner

SHOWERHEAD HAVING A DETACHABLE GAS DISTRIBUTION PLATE

CROSS-REFERENCE TO RELATED APPLICATIONS

This application is a continuation of co-pending U.S. patent application Ser. No. 13/833,257, filed Mar. 15, 2013, which claims benefit of U.S. provisional patent application Ser. No. 61/756,545, filed Jan. 25, 2013. Each of the aforementioned related patent applications is herein incorporated by reference in their entireties.

FIELD

Embodiments of the present invention generally relate to semiconductor processing equipment.

BACKGROUND

Conventional showerheads utilized in semiconductor process chambers (e.g., deposition chambers, etch chambers, or the like) typically include a gas distribution plate permanently bonded to a base. The gas distribution plate requires periodic replacement due to degradation caused by exposure to plasma during plasma processes. However, the inventors have observed that since the gas distribution plate is permanently bonded to the base, the entire showerhead assembly requires replacement in order to replace the gas distribution plate, thus making the replacement process costly.

Therefore, the inventors have provided embodiments of an improved showerhead with detachable gas distribution plate.

SUMMARY

Embodiments of showerheads having a detachable gas distribution plate are provided herein. In some embodiments, a showerhead for use in a substrate processing chamber includes a body having a first side and an opposing second side; a gas distribution plate disposed proximate the second side of the body; and a clamp disposed about a peripheral edge of the gas distribution plate to removably couple the gas distribution plate to the body, wherein the body is electrically coupled to the gas distribution plate through the clamp.

In some embodiments, a showerhead for use in a substrate processing chamber may include a body having a first side and a second side; a gas distribution plate disposed proximate the second side of the body; a clamp disposed about a peripheral edge of the gas distribution plate to removably couple the gas distribution plate to the body; and a thermal gasket disposed between the body and gas distribution plate.

In some embodiments, a process chamber may include a chamber body having a substrate support disposed within an inner volume of the chamber body; and a showerhead disposed within the inner volume of the chamber body opposite the substrate support. The showerhead includes: a body having a first side and an opposing second side, wherein the first side of the body is coupled to a component of the process chamber; a gas distribution plate disposed proximate the second side of the body; a clamp disposed about a peripheral edge of the gas distribution plate to removably couple the gas distribution plate to the body; and a thermal gasket disposed between the body and gas distribution plate.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
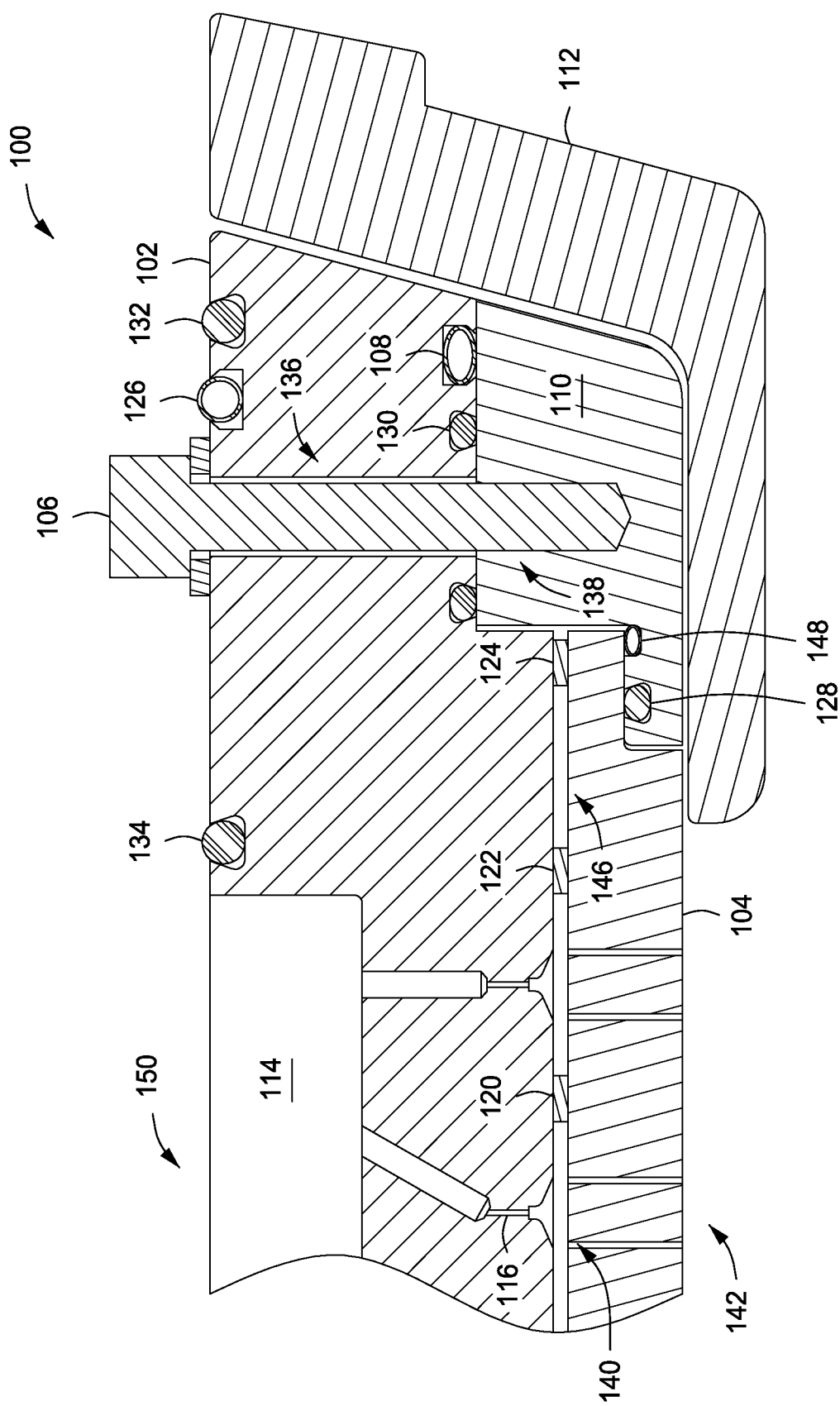
FIG. 1 depicts a showerhead with a gas distribution plate in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of showerheads having a detachable gas distribution plate are provided herein. In at least some embodiments, the inventive showerhead may advantageously allow for the removal and replacement of the gas distribution plate, thereby providing a showerhead having a longer useful life and a more cost efficient manner of replacing the gas distribution plate as compared to conventional showerheads having a permanently bonded gas distribution plate.

FIG. 1 depicts a showerhead with a gas distribution plate in accordance with some embodiments of the present invention. The showerhead 100 generally comprises a body 102, a gas distribution plate 104 and a clamp 110 configured to removably couple the gas distribution plate to the body 102.

The body 102 comprises a first side 150, a second side 140 and a plurality of through holes 116 formed in the body 102 extending from the first side 150 to the second side 140. The plurality of through holes 116 facilitate the passage of process gases through the body 102 to the gas distribution plate 104. In some embodiments, the through holes 116 may be counter sunk (e.g., countersink 118 shown) to reduce a residual electrical field at the through holes 116 and to facilitate a more uniform gas flow to the gas distribution plate 104. In some embodiments, a cavity 114 may be formed in first side 150 of the body 102 to facilitate more even distribution of process gases to the plurality of through holes 116. The body 102 may be fabricated from any suitable process compatible material, for example, such as aluminum. By fabricating the body 102 from a conductive material such as aluminum, the body 102 may function as an electrode to facilitate, for example, the formation of a plasma from process gases provided to the showerhead 100.

In some embodiments, one or more channels may be formed in the surfaces of the body 102 to accommodate one or more o-rings and/or RF gaskets (o-rings 130, 132, 134 and RF gaskets 108, 126 shown). When present, the o-rings 130, 132, 134 provide a seal between the body 102 and clamp 110 or surfaces of the process chamber (not shown).

The o-rings 130, 132, 134, may be fabricated from any material suitable to facilitate the aforementioned seal, for example, rubber. The RF gaskets 108, 126 facilitate conductivity of RF power from, for example, an RF source to the body 102 and the clamp 110. For example, RF power may be provided from an RF power supply (such as the RF power supply 248 described below) to a component coupled to the body 102 and in contact with one or more RF gaskets (e.g., RF gasket 126). The RF gaskets 108, 126 may be fabricated from any suitable conductive material, for example stainless steel.

The gas distribution plate 104 facilitates distribution of process gases provided from the body 102 to, for example, a processing volume of a process chamber via a plurality of gas distribution holes 142 formed in the gas distribution plate 104. The gas distribution holes 142 may be arranged in any manner suitable to provide a desired distribution of process gases. For example, in some embodiments, the gas distribution holes 142 may be arranged in clusters disposed about the through holes 116 of the body 102 when the gas distribution plate 104 is coupled to the body 102.

The gas distribution plate 104 may be fabricated from any material suitable to resist degradation during exposure to a plasma (e.g., a plasma formed in a process chamber during processing). For example in some embodiments, the gas distribution plate 104 may be fabricated from single crystalline silicon (Si). Single crystal silicon is not typically used as a material for the gas distribution plate at least in part due to it having a faster etch rate as compared to silicon carbide, a favored material. However, the inventors have observed that single crystalline silicon is less susceptible to surface roughness change, arcing, and micro-masking, and further provides better operability at elevated temperatures (e.g., higher than about 150 degrees Celsius) as compared to conventional materials utilized to fabricate gas distribution plates, for example, such as silicon carbide (SiC). In addition, single crystal silicon is more readily available and obtainable at a lower cost as compared to the conventional materials. In addition, in embodiments where the showerhead 100 is used in substrate processes involving silicon-containing gases, fabricating the gas distribution plate 104 from silicon reduces the instances of contamination due to degradation of the gas distribution plate 104.

The gas distribution plate 104 may have any suitable thickness sufficient to provide a desired gas distribution and suitable useful functional life. In addition, in some embodiments, the gas distribution plate 104 may have a suitable thickness sufficient to ensure continuous contact with one or more thermal gaskets (three thermal gaskets 120, 122, 124 shown) disposed between the gas distribution plate 104 and the body 102 when the gas distribution plate 104 is coupled to the body 102. For example, in some embodiments, the thickness of the gas distribution plate 104 may be selected such that an amount of bowing of the gas distribution plate 104 caused by the forces provided by the clamp 110 at the edge of the gas distribution plate 104 is less than an amount of deformation of the thermal gaskets 120, 122, 124 when compressed, thereby ensuring continuous contact with each of the thermal gaskets 120, 122, 124 when clamped. Alternatively, or in combination, in some embodiments, the thickness of the gas distribution plate 104 may be selected to provide an aspect ratio of the gas distribution holes 142 suitable to reduce plasma penetration and improve the useful functional life of the gas distribution plate 104. For example, in embodiments where the gas distribution holes 142 have a diameter of about 0.5 mm, the gas distribution plate 104 may have a thickness of about 9 mm.

The clamp 110 facilitates coupling the gas distribution plate 104 to the body 102. In some embodiments, the clamp 110 facilities such coupling via a fastener 106 provided to a through hole 136 formed in the body 102 corresponding to a threaded hole 138 formed in the clamp. The clamp 110 may be fabricated from any process compatible conductive material, for example aluminum. In some embodiments, the clamp 110 may coated with a spray coating (e.g., yttria ($Y_2O_3$)) to reduce degradation of the clamp 110 in a plasma environment.

In some embodiments, the clamp 110 may include one or more channels formed in surfaces of the clamp 110 to accommodate one or more o-rings and RF gaskets (o-ring 128 and RF gasket 148 shown). When present, the o-ring 128 provides cushioning to the gas distribution plate 104 to prevent breakage of the gas distribution plate 104 when clamped to the body 102. When present, the RF gasket 148 facilitates conductivity of RF power from the body 102, through the clamp 110, and to the gas distribution plate 104, thereby allowing the gas distribution plate 104 to function as an RF electrode. Providing the RF current path to the gas distribution plate 104 also shields a gap 146 between the body 102 and the gas distribution plate 104, which reduces arcing, for example, at the through holes 116 of the body 102. The o-ring 128 and RF gasket 148 may be fabricated from any suitable material, for example such as the materials discussed above with respect to the o-rings 130, 132, 134, and RF gaskets 108, 126.

In some embodiments, the thermal gaskets 120, 122, 124 may be disposed between the body 102 and gas distribution plate 104. When present, the thermal gaskets 120, 122, 124 may facilitate a heat exchange between the body 102 and the gas distribution plate 104, for example, to provide a more uniform thermal gradient across the gas distribution plate 104. In addition, the thermal gaskets 120, 122, 124 may provide the gap 146 between the body 102 and the gas distribution plate 104 and define separate plenums (e.g., zones) for groups of through holes 116 and corresponding gas distribution holes 142.

The thermal gaskets 120, 122, 124 may be fabricated from any compressible, thermally conductive material having low out-gassing at process pressures and temperatures (e.g., vacuum conditions and temperatures at or above about 150 degrees Celsius). For example, in some embodiments, the gasket may comprise a silicon containing material. The thermal gaskets 120, 122, 124 may have any shape suitable to maintain contact between the body 102 and the gas distribution plate 104. For example, in some embodiments, the thermal gaskets 120, 122, 124 may be a plurality of concentric rings having a rectangular cross section as shown in FIG. 1. In some embodiments, the geometry of the thermal gaskets 120, 122, 124 may be optimized to accommodate for a difference in distance between the body 102 and the gas distribution plate 104 when clamped together due to the forces provided by the clamp 110 at the edge of the gas distribution plate 104 (e.g., bowing of the gas distribution plate 104).

In some embodiments, a protective ring 112 may be disposed about the showerhead to shield portions of the body 102, clamp 110 and gas distribution plate 104. The protective ring 112 may be fabricated from any suitable process compatible material, for example, quartz ($SiO_2$).

Figure 2:
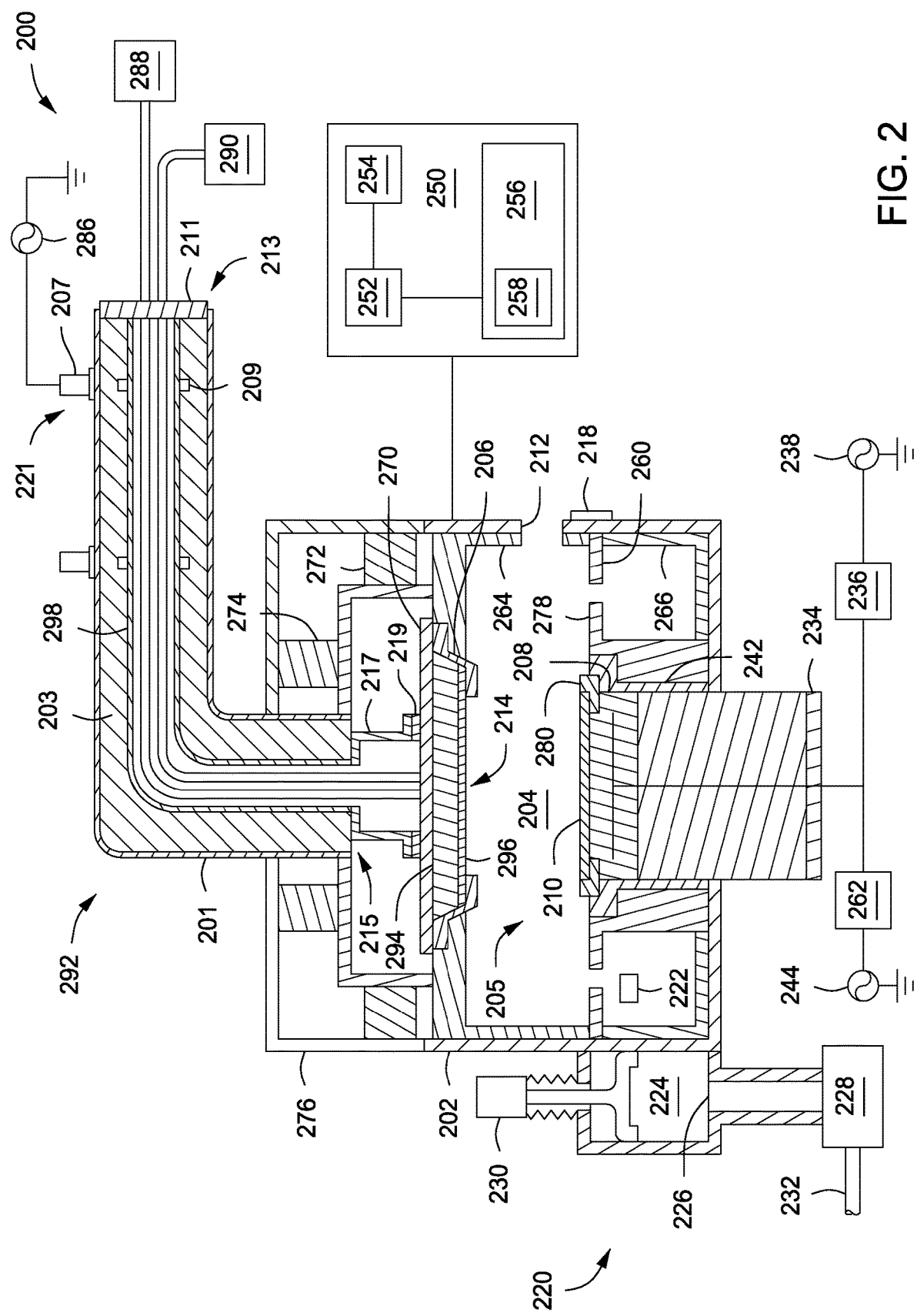
FIG. 2 depicts a process chamber suitable for use with a showerhead having a gas distribution plate in accordance with some embodiments of the present invention.

FIG. 2 depicts a schematic view of an illustrative process chamber 200 suitable for use with a showerhead in accordance with some embodiments of the present invention. Exemplary process chambers may include the ENABLER®, ENABLER® E5, ADVANTEDGE™, or other process chambers, available from Applied Materials, Inc. of Santa Clara, Calif. Other suitable process chambers having, or being modified to have, showerheads may similarly benefit from the present invention.

In some embodiments, the process chamber 200 may generally comprise a chamber body 202 having a substrate support pedestal 208 for supporting a substrate 210 thereupon disposed within an inner volume 205 of the chamber body, and an exhaust system 220 for removing excess process gases, processing by-products, or the like, from the inner volume 205 of the chamber body 202.

In some embodiments, an upper liner 264 and a lower liner 266 may cover the interior of the chamber body 202 to protect the chamber body 202 during processing. In some embodiments, the chamber body 202 has an inner volume 205 that may include a processing volume 204. The processing volume 204 may be defined, for example, between the substrate support pedestal 208 and a showerhead 214 (e.g., showerhead 100 described above) and/or nozzles provided at desired locations. In some embodiments, a gas supply 288 may provide one or more process gases to the showerhead 214 for distribution of the one or more process gases to the processing volume 204 of the chamber body 202.

In some embodiments, the substrate support pedestal 208 may include a mechanism that retains or supports the substrate 210 on the surface of the substrate support pedestal 208, such as an electrostatic chuck, a vacuum chuck, a substrate retaining clamp, or the like. Alternatively, or in combination, in some embodiments, the substrate support pedestal 208 may include mechanisms for controlling the substrate temperature (such as heating and/or cooling devices, not shown) and/or for controlling the species flux and/or ion energy proximate the substrate surface. For example, in some embodiments, the substrate support pedestal 208 may include an electrode 240 and one or more power sources (two bias power sources 238, 244) coupled to the electrode 240 via respective matching networks 236, 262. For example, the substrate support pedestal 208 may be configured as a cathode coupled to a bias power source 244 via a matching network 262. The above described bias power sources (e.g., bias power sources 238, 244) may be capable of producing up to 12,000 W at a frequency of about 2 MHz, or about 13.56 MHz, or about 60 Mhz. The at least one bias power source may provide either continuous or pulsed power. In some embodiments, the bias power source alternatively may be a DC or pulsed DC source.

In some embodiments, the substrate support pedestal 208 may include a substrate support ring 280 disposed atop the substrate support pedestal 208 and configured to support at least a portion of the substrate 210 during processing. In some embodiments, one or more rings (insert ring 278 and barrier ring 242 shown) may be disposed about the substrate support pedestal 208. The one or more rings may be fabricated from any suitable process compatible material. For example, in some embodiments, the insert ring may be fabricated from silicon (Si). In some embodiments, the barrier ring 242 may be fabricated from quartz ($SiO_2$). In some embodiments, a grounded mesh 260 may be disposed about the periphery of the substrate support pedestal 208 and coupled to the chamber body 202.

The substrate 210 may enter the chamber body 202 via an opening 212 in a wall of the chamber body 202. The opening 212 may be selectively sealed via a slit valve 218, or other mechanism for selectively providing access to the interior of the chamber through the opening 212. The substrate support pedestal 208 may be coupled to a lift mechanism 234 that may control the position of the substrate support pedestal 208 between a lower position (as shown) suitable for transferring substrates into and out of the chamber via the opening 212 and a selectable upper position suitable for processing. The process position may be selected to maximize process uniformity for a particular process. When in at least one of the elevated processing positions, the substrate support pedestal 208 may be disposed above the opening 212 to provide a symmetrical processing region.

In some embodiments, a protective ring 206 (e.g., the protective ring 112 described above) may be disposed about, and covering at least a portion of, the showerhead 214, for example, such as the body 294 (e.g., body 102 described above) or the gas distribution plate 296 (e.g., the gas distribution plate 104 described above) of the showerhead 214. In some embodiments, the protective ring 206 may be supported by the upper liner 264.

In some embodiments, the showerhead 214 may be coupled to and/or supported by, a chiller plate 284. When present, the chiller plate 284 facilitates control over a temperature of the showerhead 214 during processing. In some embodiments, the chiller plate 284 comprises a plurality of channels (not shown) formed in the chiller plate 284 to allow a temperature control fluid provided by a temperature control fluid supply (chiller) 290 to flow through the chiller plate 284 to facilitate the control over the temperature of the showerhead 214.

In some embodiments, one or more coils (inner coil 274 and outer coil 272 shown) may be disposed above and/or proximate a peripheral edge of the showerhead 214. When present, the one or more coils may facilitate shaping a plasma formed within the processing volume 204 of the process chamber 200.

In some embodiments, an RF power source 286 provides RF power to the chiller plate 270 and/or the showerhead 214 via a coaxial stub 292. The coaxial stub 292 is a fixed impedance matching network having a characteristic impedance, resonance frequency, and provides an approximate impedance match between the showerhead 214 and the RF power source 286. In some embodiments, the coaxial stub 292 generally comprises an inner cylindrical conductor 298, an outer cylindrical conductor 201 and an insulator 203 filling the space between the inner cylindrical conductor 298 and the outer cylindrical conductor 201.

The inner cylindrical conductor 298 and the outer cylindrical conductor 201 may be constructive of any suitable conductive material capable of withstanding the particular process environment. For example, in some embodiments, the inner cylindrical conductor 298 and the outer cylindrical conductor 201 may be fabricated from nickel-coated aluminum. One or more taps 221 are provided at particular points along the axial length of the coaxial stub 292 for applying RF power from the RF power source 286 to the coaxial stub 292. An RF power terminal 207 and the RF return terminal 209 of the RF power source 286 are connected at the tap 221 on the coaxial stub 292 to the inner cylindrical conductor 298 and the outer cylindrical conductor 201, respectively. A terminating conductor 211 at the far end 213 of the coaxial stub 292 shorts the inner cylindrical conductor 298 and the outer cylindrical conductor 201 together, so that the coaxial stub 292 is shorted at its far end 213. At the near end 215 of the coaxial stub 292, the outer cylindrical conductor 201 is connected to the chamber body 202 via an annular conductive housing or support 276, while the inner cylindrical conductor 298 is connected to the chiller plate 270 and/or showerhead 214 via a conductive cylinder 217. In some embodiments, a dielectric ring 219, is disposed between and separates the conductive cylinder 217 and the chiller plate 270.

The exhaust system 220 generally includes a pumping plenum 224 and one or more conduits that couple the pumping plenum 224 to the inner volume 205 (and generally, the processing volume 204) of the chamber body 202, for example via one or more inlets 222. A vacuum pump 228 may be coupled to the pumping plenum 224 via a pumping port 226 for pumping out the exhaust gases from the chamber body 202. The vacuum pump 228 may be fluidly coupled to an exhaust outlet 232 for routing the exhaust as required to appropriate exhaust handling equipment. A valve 230 (such as a gate valve, or the like) may be disposed in the pumping plenum 224 to facilitate control of the flow rate of the exhaust gases in combination with the operation of the vacuum pump 228. Although a z-motion gate valve is shown, any suitable, process compatible valve for controlling the flow of the exhaust may be utilized.

To facilitate control of the process chamber 200 as described above, the controller 250 may be one of any form of general-purpose computer processor that can be used in an industrial setting for controlling various chambers and sub-processors. The memory, or computer-readable medium, 256 of the CPU 252 may be one or more of readily available memory such as random access memory (RAM), read only memory (ROM), floppy disk, hard disk, or any other form of digital storage, local or remote. The support circuits 254 are coupled to the CPU 252 for supporting the processor in a conventional manner. These circuits include cache, power supplies, clock circuits, input/output circuitry and subsystems, and the like.

One or more methods and/or processes may generally be stored in the memory 256 as a software routine 258 that, when executed by the CPU 252, causes the process chamber 200 to perform the processes methods and/or processes. The software routine 258 may also be stored and/or executed by a second CPU (not shown) that is remotely located from the hardware being controlled by the CPU 252. Some or all of the method of the present invention may also be performed in hardware. As such, the methods and/or processes may be implemented in software and executed using a computer system, in hardware as, e.g., an application specific integrated circuit or other type of hardware implementation, or as a combination of software and hardware. The software routine 258 may be executed after the substrate 210 is positioned on the substrate support pedestal 208. The software routine 258, when executed by the CPU 252, transforms the general purpose computer into a specific purpose computer (controller) 250 that controls the chamber operation such that the methods disclosed herein are performed.

Thus, embodiments of a showerhead having a detachable gas distribution plate have been provided herein. Embodiments of the inventive showerhead may advantageously provide a longer useful life and a more cost efficient manner of replacing the gas distribution plate as compared to conventional showerheads.

While the foregoing is directed to embodiments of the present invention, other and further embodiments of the invention may be devised without departing from the basic scope thereof.

The invention claimed is:

1. A showerhead for use in a substrate processing chamber, comprising:
   a body having a first side and an opposing second side;
   a gas distribution plate disposed proximate the second side of the body; and
   a clamp disposed about a peripheral edge of the gas distribution plate to removably couple the gas distribution plate to the body, wherein the body is electrically coupled to the gas distribution plate through the clamp, and wherein a lower surface of the clamp is substantially coplanar with a lowermost surface of the gas distribution plate, wherein the clamp has a continuous contact surface with no through holes.

2. The showerhead of claim 1, further comprising one or more thermal gaskets disposed between the body and the gas distribution plate.

3. The showerhead of claim 2, wherein the one or more thermal gaskets comprise a plurality of concentric rings disposed between the body and the gas distribution plate to provide a gap between the body and the gas distribution plate.

4. A showerhead for use in a substrate processing chamber, comprising:
   a body having a first side and an opposing second side;
   a gas distribution plate disposed proximate the second side of the body;
   a clamp disposed about a peripheral edge of the gas distribution plate to removably couple the gas distribution plate to the body, wherein the body is electrically coupled to the gas distribution plate through the clamp, and wherein a lower surface of the clamp is substantially coplanar with a lower surface of the gas distribution plate; and
   a ring disposed about the peripheral edge of the body and the clamp and extending over a portion of the gas distribution plate to cover at least a portion of the body and at least a portion of the gas distribution plate.

5. The showerhead of claim 1, further comprising a first RF gasket disposed between the clamp and the body to facilitate coupling RF power from the body to the clamp, and a second RF gasket disposed between the clamp and the gas distribution plate to facilitate coupling RF power from the clamp to the gas distribution plate.

6. The showerhead of claim 1, wherein the body comprises a plurality of through holes extending from the first side to the second side of the body.

7. The showerhead of claim 6, wherein the body comprises a plenum formed in the first side of the body, the plenum fluidly coupled to the plurality of through holes.

8. The showerhead of claim 1, wherein the clamp is disposed within a notch in a lower peripheral edge of the body.

9. The showerhead of claim 1, wherein the gas distribution plate is fabricated from single crystalline silicon (Si).

10. A process chamber, comprising:
    a chamber body having a substrate support disposed within an inner volume of the chamber body; and
    the showerhead of claim 1 disposed within the inner volume of the chamber body opposite the substrate support,
      wherein the first side of the body of the showerhead is coupled to a component of the process chamber.

11. The process chamber of claim 10, wherein the component of the process chamber is a chiller plate, and wherein the chiller plate is coupled to a ceiling of the chamber body.

12. The showerhead of claim 4, further comprising one or more thermal gaskets disposed between the body and the gas distribution plate.

13. The showerhead of claim 12, wherein the one or more thermal gaskets comprise a plurality of concentric rings disposed between the body and the gas distribution plate.

14. The showerhead of claim 1, further comprising:
a ring disposed about the peripheral edge of the body and the clamp and extending over a portion of the clamp to cover at least a portion of the body and at least a portion of the gas distribution plate.

15. The process chamber of claim 10, further comprising a ring disposed about the peripheral edge of the body of the showerhead, wherein the ring is supported by a liner disposed within the chamber body.

16. The showerhead of claim 4, further comprising a first RF gasket disposed between the clamp and the body to facilitate coupling RF power from the body to the clamp.

17. The showerhead of claim 4, further comprising a second RF gasket disposed between the clamp and the gas distribution plate to facilitate coupling RF power from the clamp to the gas distribution plate.

18. The showerhead of claim 4, wherein an outer sidewall of the body is coplanar with an outer sidewall of the clamp.

19. A process chamber, comprising:
a chamber body having a substrate support disposed within an inner volume of the chamber body; and
a showerhead disposed within the inner volume of the chamber body opposite the substrate support, the showerhead comprising:
a body having a first side and an opposing second side, wherein the first side of the body is coupled to a component of the process chamber;
a gas distribution plate disposed proximate the second side of the body; and
a clamp disposed about a peripheral edge of the gas distribution plate to removably couple the gas distribution plate to the body, wherein the body is electrically coupled to the gas distribution plate through the clamp, and wherein a lower surface of the clamp is substantially coplanar with a lowermost surface of the gas distribution plate, wherein an outer sidewall of the body is coplanar with an outer sidewall of the clamp.

20. The process chamber of claim 19, wherein the clamp is disposed within a notch in a lower peripheral edge of the body.

* * * * *